United States Patent [19]

Inderbiethen

[11] 3,982,720

[45] Sept. 28, 1976

[54] CANDLE CASTING APPARATUS AND METHOD

[75] Inventor: Herbert Inderbiethen, Nettetal, Germany

[73] Assignee: Spezial-Maschinenfabrik Hans Kurschner, Kaldenkirchen, Germany

[22] Filed: Mar. 4, 1974

[21] Appl. No.: 447,516

[30] Foreign Application Priority Data

| | | |
|---|---|---|
| Mar. 9, 1973 | Germany | 2311699 |
| Mar. 9, 1973 | Germany | 2311700 |

[52] U.S. Cl. .................................... 249/81; 249/119; 425/803

[51] Int. Cl.² ............................................ G11C 5/00

[58] Field of Search ............. 249/81, 119; 425/803; 264/59

[56] References Cited

UNITED STATES PATENTS

| | | | |
|---|---|---|---|
| 269,885 | 1/1883 | Roycau | 425/803 X |
| 1,482,000 | 1/1924 | Engman | 425/803 X |
| 1,784,174 | 12/1930 | Buhler | 249/119 |
| 2,053,926 | 9/1936 | Suiter | 249/119 X |
| 2,298,913 | 10/1942 | Arden et al. | 249/81 X |
| 2,310,830 | 2/1943 | Blair et al. | 249/119 X |
| 3,607,134 | 9/1971 | McIntyre | 249/119 X |
| 3,721,419 | 3/1973 | Bolinger | 425/803 |

FOREIGN PATENTS OR APPLICATIONS

| | | | |
|---|---|---|---|
| 138,435 | 2/1920 | United Kingdom | 425/803 |

*Primary Examiner*—Francis S. Husar
*Assistant Examiner*—Robert J. Charvat
*Attorney, Agent, or Firm*—Hans Berman

[57] ABSTRACT

Candles are cast in multiple, tubular, upright molds set in a housing having a normally horizontal top plate, the molds having spherically arcuate top end portions which slightly project beyond the top plate so that a unitary body of molten wax which initially fills the molds and covers the top plate shrinks during its solidification sufficiently that the top end portions of the molds are exposed, and the wax in the molds pulls away from the wax on the top plate, whereby manual finishing of the candle ends may be avoided.

9 Claims, 4 Drawing Figures

CANDLE CASTING APPARATUS AND METHOD

Figure 1:
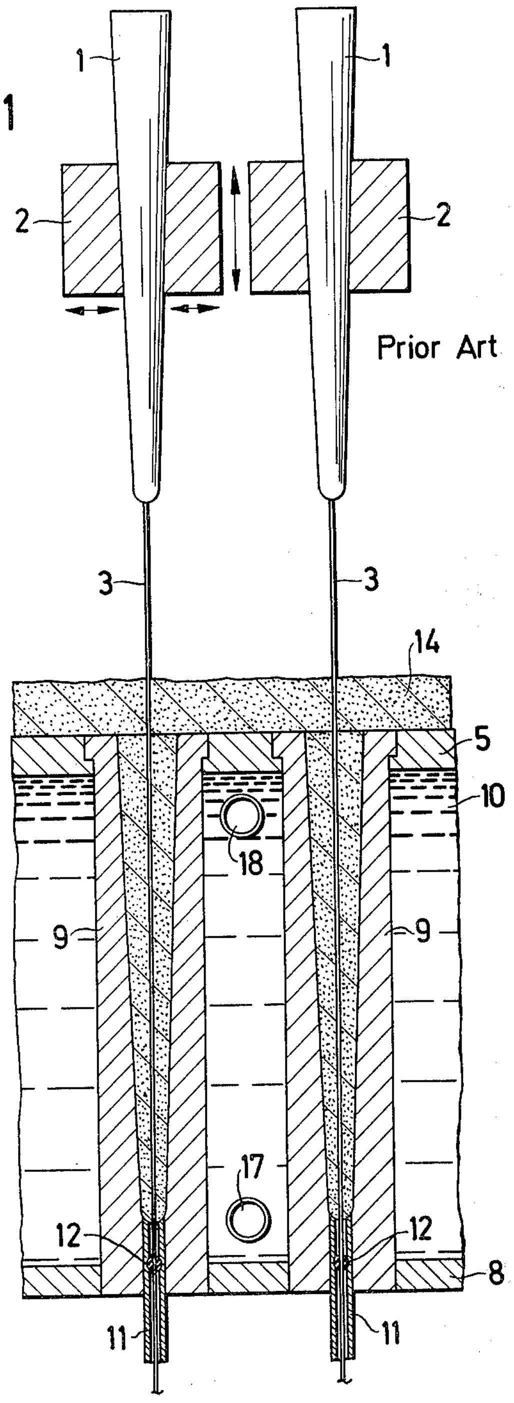

This invention relates to apparatus for simultaneously casting a plurality of candles.

It has been common practice heretofore to cast candles in tubular upright molds whose axial ends are sealingly received in vertically aligned openings in the top and bottom plates of a housing. A cooling fluid in the housing is kept in contact with the outer surfaces of the molds. The upper axial ends of the molds are flush with the exposed surface of the top plate, and wax for the candles to be cast is poured on the top plate from which it flows into the individual molds of the known apparatus. As the wax in the molds cools, solidifies, and shrinks, the still liquid wax on the top plate flows into the molds to compensate for the shrinkage. Ultimately, there is obtained a horizontal wax plate from which individual candles depend integrally into the molds.

Manual labor is needed to cut the candles free from the layer of wax solidified on the top plate, whereupon the candles can be ejected from the molds and usually require further finishing of the ends formed in the top end of each mold.

The relatively heavy layer of wax maintained on the top plate retards cooling and solidification of the wax in the candle molds, and the time required for cutting the individual candles from the connecting plate further reduces the production rate.

It is a primary object of this invention to provide candle casting apparatus which avoids manual work on the candles, and is capable of being fully automatized.

Apparatus of the invention has a multiplicity of tubular candle molds having each an axial bore. A housing of the apparatus has a top plate and a bottom plate vertically spaced downward from the top plate in the operating position of the apparatus. The two plates are formed with respective aligned openings, and each candle mold is sealingly received in an opening in the top plate and an aligned opening of the bottom plate and projects axially beyond the top plate a small distance, typically smaller than the width of the bore in the mold, preferably smaller than 5 mm, and in best practice not greater than 2 mm.

In operating this apparatus, molten wax is deposited in the molds of the apparatus in its operating position, the amount of wax being sufficient to fill each mold and to cover the top plate and the projecting mold portions to a certain depth with a unitary body of molten wax. The deposited wax thereafter is cooled until at least the wax in the molds partly solidifies, whereby the solidifying wax shrinks. The afore-mentioned depth is selected small enough so that the solidifying wax in each mold separates at least partly, but preferably completely from the wax covering the top plate, and the projecting portions of the mold are exposed. The at least partly solidified wax may then be discharged from each mold after it has become shape-retaining without requiring manual labor for cutting it free of the wax plate solidifying on the top plate of the housing.

Figure 2:
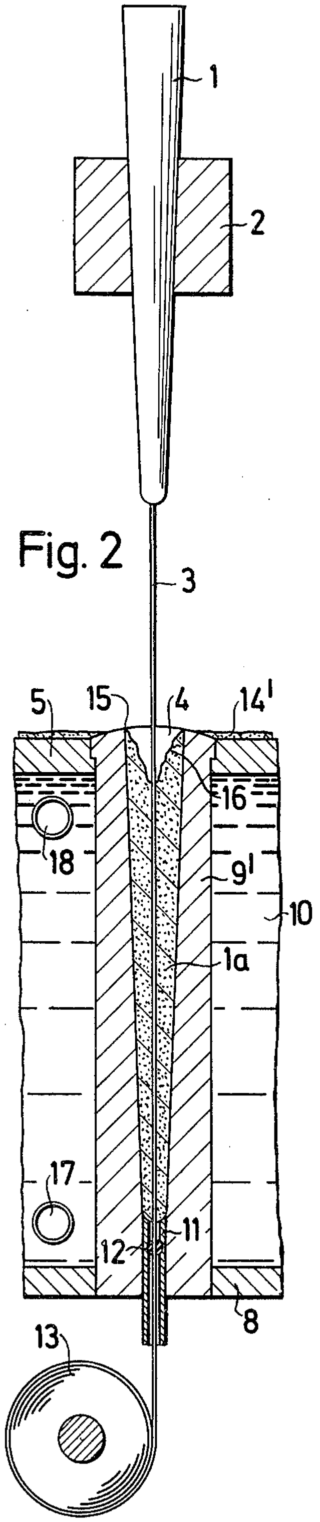
Figure 3:
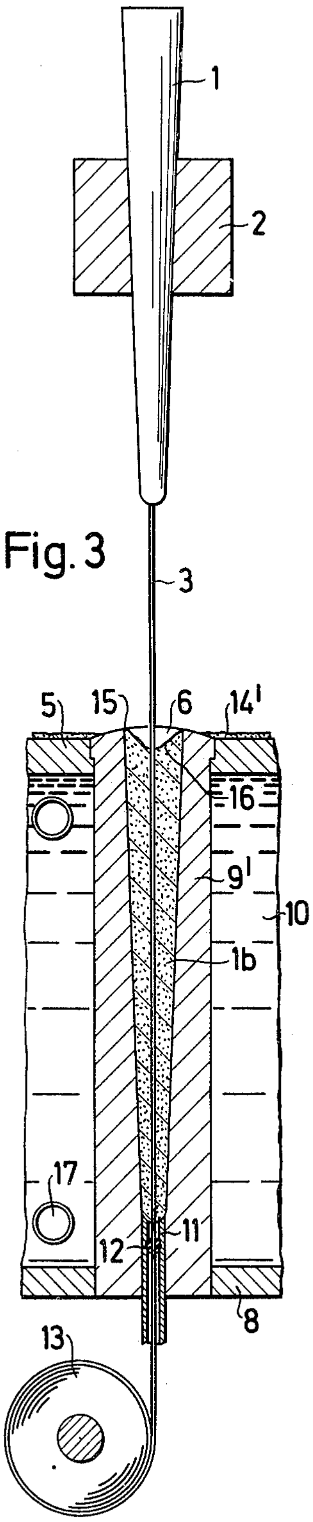
Figure 4:
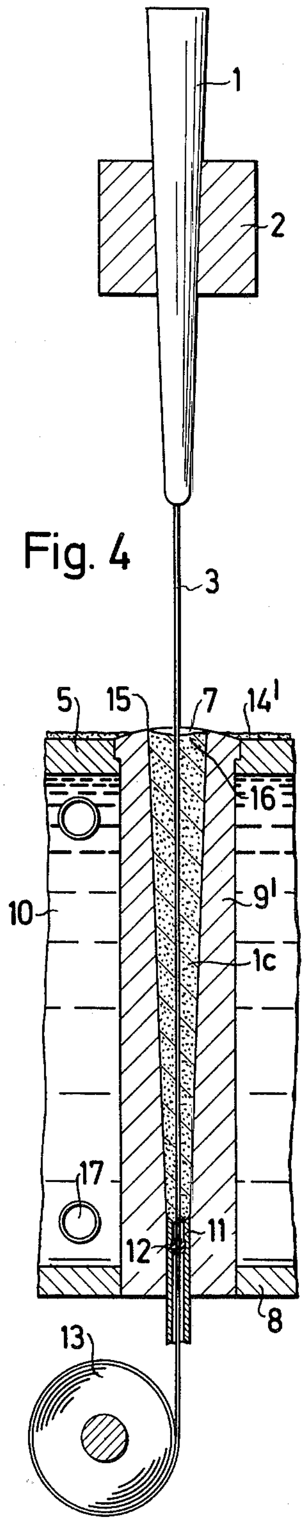

Other features, additional objects, and many of the attendant advantages of this invention will readily be appreciated as the same becomes better understood by reference to the following detailed description of the prior art and of a preferred embodiment of the invention when considered in connection with the appended drawing in which:

FIG. 1 shows a known candle casting apparatus in fragmentary elevational section; and FIGS. 2 to 4 show improved apparatus of the invention in three stages of the candle casting process in views corresponding to that of FIG. 1.

The known candle casting apparatus shown in FIG. 1 has a metal housing of which only portions of a top plate 5 and a bottom plate 8 are seen in the drawing. Vertically aligned pairs of openings in the two plates 5, 8 sealingly receive respective axial ends of tubular molds 9. The axial bore of each mold 9 tapers conically from a big top end of the mold, flush with the plate 5, to a small, cylindrical bottom end in which a tubular ejector pin 11 is received. A perforated bead 12 in the bore of each pin 11 passes a wick 3 with little clearance so as to plug the lower end of the associated mold 9 and prevent the escape of molten wax from the mold by gravity.

In the initial stage of the conventional candle casting operation illustrated in FIG. 1, a unitary body 14 of molten wax covers the top plate 5 to a depth of typically 3 cm and fills each mold 9. While only two molds are seen in FIG. 1, and only one is seen in each of FIGS. 2 to 4, it will be understood that the number of molds 9 in each housing may be 144 or more.

The cavity 10 of the housing is filled with water which may be renewed continuously by a fresh supply admitted through a pipe 17 near the bottom plate 8, while water heated by the heat of solidification of the wax body 14 is discharged from the cavity 10 through a pipe 18.

The term "wax" is being used broadly herein to designate the many amorphous or microcrystalline organic materials employed in the candlemakers art for making the body of a candle. It is a common property of waxes that their specific gravity increases greatly during solidification. The wax solidifies quickest along the inner walls of the molds 9 so that a void would be formed in each mold if the volume lost by shrinkage were not made up by flow of still liquid wax from the layer on the top plate 5 into each mold.

Ultimately, all molds 9 are filled with candle-shaped bodies of wax sufficiently solidified to be shape-retaining, and their top ends are connected integrally by a plate-shaped, solid body of wax, not as thick as the initially deposited liquid layer, but still heavy enough to require the use of a special knife for cutting the individual candles loose so that they may be discharged from the molds 9 first by the ejector pins 11 whose outwardly projecting lower ends are pushed inward of the associated molds.

Pairs of clamps 2 are mounted above each mold 9 and may be moved toward and away from each other and vertically toward and away from the top plate 5, as indicated by double arrows. In the illustrated condition of the known apparatus, the clamps 2 hold candles 1 cast in a previous operating cycle and connected with the freshly poured liquid wax by wicks 3. The wicks are cut when the freshly cast candles are cut loose from the solidified wax on the top plate 5, the previously finished candles 1 are released from the clamps 2, and the newly cast candles, partly ejected by the pins 11, are gripped and raised by the clamps 2 to permit the next batch of candles to be cast.

The improved casting apparatus of the invention shown in FIGS. 2 to 4 differs from the known apparatus of FIG. 1 by molds 9′ whose top ends project upward beyond the top plate 5, the projecting part of each mold being approximately spherically arcuate about a center of curvature located in the upright axis of the mold. The orifice 16 of the axial bore in the mold intersects the convexly arcuate upper end face in an annular edge 15 which is acutely angular, and the end face slopes obliquely downward from the orifice 16 toward the planar, exposed surface of the top plate 5 which extends in a closed loop about each mold and separates the molds from each other.

The casting apparatus of the invention otherwise includes all elements described with reference to FIG. 1, and not requiring repeated description. Reels 13 wound with a continuous strand of wick 3 are arranged on the non-illustrated frame of the apparatus below each tubular ejector pin 11, and the strand is threaded through the passage in the associated pin 11.

When candles are to be cast in the improved apparatus of the invention, a unitary body of wax is deposited in the bore of each mold 9′ and on the top plate 5 of the water-filled housing, but the wax layer 14′ on the top plate 5 is made so thin that the wax level outside each mold 9′ drops below the edge 15 during solidification of the wax, and a funnel-shaped shrinkage cavity or pipe 4 is formed in the wax body 1*a* in the upper orifice 16 of the mold. More molten wax may then be deposited on the top plate 5 until some wax may flow into the mold orifice, but the continuity between the wax in the mold 9′ and the freshly poured wax on the top plate 5 is again interrupted as the edge 15 becomes exposed during the second stage of shrinkage, while a smaller cavity 6 forms in the bigger end of the wax body 1*b* solidifying into a candle in the mold 9′ as is shown in FIG. 3. The replenishing procedure may be repeated again ultimately to produce a wax body 1*c* whose small shrinkage cavity 7 is acceptable in the finished candle.

No manual labor is required for separating the wide end of the wax body 1*c* in which a length of wick 3 is embedded from a body of wax connecting the individual castings. The wax body may be ejected from the mold 9′ as soon as it sufficiently solidified to retain its shape during ejection, and may then be held by clamps 2 during the next casting cycle to complete solidification. No further finishing is necessary.

The procedure described above with reference to FIGS. 2 to 4 may be fully automatized in an obvious manner since it does not require the intervention of a human operator for separating the cast candles from a connecting wax bridge. Molten wax may be supplied in the required amounts from time to time from a system in which the wax is continuously circulated from a heated tank through insulated pipes back into the tank, and released to the casting apparatus from time to time through electrically operated valves. The ejector pins 11 and the clamps 2 readily lend themselves to automatic operation in timed sequence, and the finished candles may be transferred automatically from the clamps 2 to a storage bin or to packaging equipment in a manner not shown, but conventional.

The molds 9′ illustrated in FIGS. 2 to 4 are also suitable for a bottom pouring operation in which wax admitted near the small end of the mold bore initially overflows the edge 15, but then shrinks away from the edge in the manner described above. It is generally preferred that the edge 15 be exposed completely prior or during ultimate shrinkage of the wax in the mold 9′, but the advantages of the invention are largely maintained even if thin and narrow wax bridges remain at the completion of the casting cycle and partly cover the edge 15 since they are readily broken during ejection of the wax body 1*c*.

The layer of wax ultimately solidified on the top plate 5 should be as thin as possible to reduce the heating effect of this wax on the cooling water in the cavity 10 and the resulting delay in the solidification of the wax in the candle molds 9′. The solidified wax layer on the top plate 5 should also be thin so that it is quickly melted again at the beginning of the next casting cycle. The necessary thickness of this layer is determined by the height to which the edge 15 projects beyond the top surface of the plate 5. The height of the projecting mold portion thus should not be greater than the width of the bore in the mold at the big end of the same, better is not greater than 5 mm, and can be held to 2 mm or less with precise metering equipment for the molten wax.

The illustrated molds 9′ are of circular cross section and taper at a relatively great apex angle in a downward direction. The cross sectional shape of the molds, however, is without relevance to this invention, and the change in cross section along the mold axis may be chosen to suit the method employed for releasing the shaped wax body from the mold. The method of the invention is used to advantage when casting candles in split molds which need to be opened for removing the molded wax body.

It should be understood, therefore, that the foregoing disclosure relates only to a preferred embodiment of the invention, and that it is intended to cover all changes and modifications of the example of the invention herein chosen for the purpose of the disclosure which do not constitute departes from the spirit and scope of the invention set forth in the appended claims.

What is claimed is:

1. A candle casting apparatus comprising:
   - a. a plurality of tubular candle casting molds, each mold having an axis and an axial bore;
   - b. a housing defining an enclosure and having a top plate and a bottom plate spaced from said top plate,
     1. said plates being formed with respective aligned openings,
     2. an exposed surface portion of said top plate extending in a closed loop about each opening in said top plate and separating the associated opening from the other openings in said top plate,
     3. each of said molds being received in a respective opening of said top plate and an aligned opening of said bottom plate and projecting axially beyond the exposed surface portion associated with the opening in said top plate receiving said mold; and
   - c. means communicating with the interior of said enclosure for maintaining a cooling fluid in said housing in thermal contact with the outer surface of said molds which is within said enclosure.

2. Apparatus as set forth in claim 1, wherein said distance is smaller than 5 mm.

3. Apparatus as set forth in claim 1, wherein said distance is not greater than 2 mm.

4. Apparatus as set forth in claim 1, wherein said bore tapers in a direction from said top plate to said bottom plate, whereby said bore has a small end and a big end, the apparatus further comprising plug means in the small end of the bore of each mold for preventing flow of molten wax from said mold through said small end.

5. Apparatus as set forth in claim 1, wherein said bore has two ends, the apparatus further comprising plug means in one end of the bore of each mold for preventing flow of molten wax from said mold through said one end.

6. Apparatus as set forth in claim 5, wherein said plug means include an ejector member axially movable into and outward of said bore, said ejector member being formed with an axial passage therethrough, a source of a continuous strand of wick material, said strand passing through said passage and outward of said bore through the other end of the same, and clamping means axially spaced from said other end for clamping a candle ejected from said bore by said ejector member when moving inward of said one end.

7. Apparatus as set forth in claim 1, wherein said bore has an orifice in the portion of each mold projecting beyond said top plate, said projecting portion sloping obliquely from said orifice toward said top plate.

8. Apparatus as set forth in claim 7, wherein said projecting portion is approximately spherically arcuate about a center of curvature in said axis.

9. Apparatus as set forth in claim 1, wherein said surface portions face in a direction away from said bottom plate, and said molds projecting from said surface portions in said direction.

* * * * *